United States Patent
Shtilerman

(10) Patent No.: US 10,318,654 B2
(45) Date of Patent: Jun. 11, 2019

(54) SLICING AND/OR TEXTURING FOR THREE-DIMENSIONAL PRINTING

(71) Applicant: Stratasys Ltd., Rehovot (IL)

(72) Inventor: Stanislav Shtilerman, Modiln (IL)

(73) Assignee: Stratasys Ltd., Rehovot (IL)

( * ) Notice: Subject to any disclaimer, the term of this patent is extended or adjusted under 35 U.S.C. 154(b) by 742 days.

(21) Appl. No.: 14/773,761

(22) PCT Filed: Mar. 13, 2014

(86) PCT No.: PCT/IL2014/050276
§ 371 (c)(1),
(2) Date: Sep. 9, 2015

(87) PCT Pub. No.: WO2014/141273
PCT Pub. Date: Sep. 18, 2014

(65) Prior Publication Data
US 2016/0019319 A1    Jan. 21, 2016

Related U.S. Application Data

(60) Provisional application No. 61/782,142, filed on Mar. 14, 2013.

(51) Int. Cl.
*B33Y 50/02* (2015.01)
*G06F 17/50* (2006.01)
(Continued)

(52) U.S. Cl.
CPC ............ *G06F 17/50* (2013.01); *B29C 64/386* (2017.08); *B33Y 50/02* (2014.12);
(Continued)

(58) Field of Classification Search
CPC ............................... B33Y 50/02; B29C 64/386
(Continued)

(56) References Cited

U.S. PATENT DOCUMENTS

| 2006/0290032 A1* | 12/2006 | Sano ............. B29C 64/165 264/494 |
| 2009/0174709 A1 | 7/2009 | Kozlak et al. |
| 2013/0009338 A1 | 1/2013 | Mayer |

FOREIGN PATENT DOCUMENTS

| CN | 101244629 | 8/2008 |
| CN | 102470609 | 5/2012 |

(Continued)

OTHER PUBLICATIONS

Translation of Notice of Reasons for Rejection dated Oct. 16, 2017 From the Japan Patent Office Re. Application No. 2015-562558. (7 Pages).

(Continued)

*Primary Examiner* — Christina A Johnson
*Assistant Examiner* — Xue H Liu

(57) ABSTRACT

A method for slicing a three-dimensional model for printing of a corresponding object by a 3D printer, comprises: obtaining the envelope of the object as polygons, then for each region of a predefined work area within the slicing plane: identifying the closest polygon of said envelope that is positioned above said respective pixel; where no polygon is identified, then marking a corresponding region as a no-print region; if the direction vector of said closest above polygon has a positive component in the Z direction, then marking said corresponding region as a model region; and if the direction vector of said polygon has a negative component in the Z direction, then marking the region as a support region, and printing accordingly. An advantage of the above procedure is that the slicing, and in addition texture mapping, can be efficiently carried out on a graphics card or GPU.

9 Claims, 3 Drawing Sheets

(51) Int. Cl.
    G05B 19/4099     (2006.01)
    G06T 17/10       (2006.01)
    B29C 64/386      (2017.01)
    B33Y 10/00       (2015.01)
(52) U.S. Cl.
    CPC .......... *G05B 19/4099* (2013.01); *G06T 17/10* (2013.01); *B33Y 10/00* (2014.12); *G05B 2219/49014* (2013.01); *G05B 2219/49039* (2013.01)
(58) Field of Classification Search
    USPC ................................................ 264/401, 497
    See application file for complete search history.

(56) References Cited

FOREIGN PATENT DOCUMENTS

| JP | 2004-160858 | 6/2004 |
|----|-------------|--------|
| JP | 2008-094001 | 4/2008 |
| JP | 2010-089438 | 4/2010 |
| WO | WO 2014/141273 | 9/2014 |

OTHER PUBLICATIONS

Communication Pursuant to Article 94(3) EPC dated May 10, 2017 From the European Patent Office Re. Application No. 14719531.7.
Notice of Reason for Rejection dated Oct. 16, 2017 From the Japan Patent Office Re. Application No. 2015-562558. (6 Pages).
Translation of Notification of Office Action dated Feb. 24, 2017 From the State Intellectual Property Office of the People's Republic of China Re. Application No. 201480020330.5. (2 Pages).
Communication Relating to the Results of the Partial International Search dated Oct. 13, 2014 From the International Searching Authority Re. Application No. PCT/IL2014/050276.
International Preliminary Report on Patentability dated Sep. 24, 2015 From the International Bureau of WIPO Re. Application No. PCT/IL2014/050276.
International Search Report and the Written Opinion dated Feb. 6, 2015 From the International Searching Authority Re. Application No. PCT/IL2014/050276.
Chang "Direct Slicing and G-Code Contour for Rapid Prototyping Machine of UV Resin Spray Using PowerSOLUTION Macro Commands", The International Journal of Advanced Manufacturing Technology, XP002730211, 23(5-6): 358-365, Dec. 18, 2003. p. 358, 361.
Hradec "Realtime Slicer Proof of Concept Using GPU", ChemShapes Open Source 3D Rapid Modeling Technology, XP002730210, 4 P., Jul. 22, 2011.
Huang et al. "Sloping Wall Structure Support Generation for Fused Deposition Modeling", The International Journal of Advanced Manufacturing Technology, XP002730212, 42(11-12): 1074-1081, Published Online Aug. 1, 2008. p. 1074-1076.
Translation of Notification of Office Action dated Jun. 27, 2016 From the State Intellectual Property Office of the People's Republic of China Re. Application No. 201480020330.5.
Notification of Office Action and Search Report dated Feb. 24, 2017 From the State Intellectual Property Office of the People's Republic of China Re. Application No. 201480020330.5 and Its Summary in English. (6 Pages).
Notification of Office Action and Search Report dated Jun. 27, 2016 From the State Intellectual Property Office of the People's Republic of China Re. Application No. 201480020330.5.
Reasons for Rejection dated Mar. 26, 2019 From the Korean Intellectual Property Office Re. Application No. 10-2015-7028874 and Its Translation Into English. (6 Pages).

* cited by examiner

SLICING AND/OR TEXTURING FOR THREE-DIMENSIONAL PRINTING

RELATED APPLICATIONS

This application is a National Phase of PCT Patent Application No. PCT/IL2014/050276 having International filing date of Mar. 13, 2014, which claims the benefit of priority under 35 USC § 119(e) of U.S. Provisional Patent Application No. 61/782,142 filed on Mar. 14, 2013. The contents of the above applications are all incorporated by reference as if fully set forth herein in their entirety.

FIELD AND BACKGROUND OF THE INVENTION

The present invention, in some embodiments thereof, relates to a way of carrying out slicing for three dimensional printing and, more particularly, but not exclusively, to a way that is particularly suitable for being implemented on a graphics card or graphical processing unit (GPU).

Three-dimensional (3D) inkjet printing in its broadest sense is a form of additive manufacture, in which any material that can be squeezed through an injection nozzle is applied in layers, in accordance with a plan or model, to form a three-dimensional object.

The model may be obtained in any one of a number of ways, for example by carrying out 3D measurements of an original product that it is desired to copy. Alternatively, a 3D design from a computer aided design (CAD) package may be used. As a further alternative, a 3D design may be generated by a user on the fly, using a suitable graphics package.

A 3D model cannot usually be manufactured in its final form, since each layer is molten when injected and usually has to be at least partially supported during its manufacture. Thus support structures are usually provided, which can subsequently be removed. Any printing plan for the object should include the printing of such support structures, and may incorporate a way of making the support structures easily removable following printing.

Furthermore, the 3D model may require colors and textures, textures being surface features of different kinds, which may simply be flat patterns, or may extend into the depth of the model to some extent. Likewise the support structure may have texture applied to it, particularly at the surface, for example in order to make it easily removable.

The 3D model may further include different materials for different locations. Thus waterproofing may be needed around an outer surface or a soft inside might require a hard shell etc.

The 3D model has to be converted into instructions in order to operate the print head. Typically the model is cut into slices and each pixel of each slice is then modified by a texture file. Likewise each individual pixel is tested against an envelope of the model to determine whether the pixel is inside the envelope and is part of the model, is below the envelope and therefore is part of the support or is outside the envelope and is thus not to be printed. The pixel is then modified for texture from a separate texture file. Instructions may then be generated to operate the printer head to print the slice.

Thus, the slices are generated pixel by pixel, requiring considerable memory since each pixel is individually remembered. The calculations are typically carried out on the Central Processing Unit (CPU) part of the computer, or may use customized calculations on the GPU, or other graphics hardware, the customized calculations being complicated and lengthy.

Graphical processing is generally available on most computers in the form of a GPU, typically provided in a separate graphics card. Graphics cards are designed with pipelines optimized for graphical processing in ways that bypass the calculations of individual pixels. However the graphics card is not used directly to produce the 3D printing instructions from the 3D model because the graphics card is designed to provide a 2D projection of a 3D image. 3D processing on a graphics card is typically built in with video games in mind, to rapidly produce the 2D projection. In 3D imaging the actual 3D shape, and not a projection, is required. Hence, if the graphics card is to be used for 3D printing, it can only be through customized solutions.

SUMMARY OF THE INVENTION

The present embodiments relate to carrying out the process of converting the 3D model into print instructions based on identifying and manipulating volumes, rather than calculating and defining individual pixels. Such a process is particularly suited to being carried out on a graphics card, where the projection functions can be used to produce the slices and clipping can be used to determine whether a particular part of the volume is part of the support, of the model itself or is not to be printed.

According to an aspect of some embodiments of the present invention there is provide a method for slicing a three-dimensional model for printing of a corresponding object by a 3D printer, the slicing made within a space having a Z axis, the Z axis being perpendicular to a printing plane, the method comprising:

obtaining a representation of an envelope of an object as a collection of planar polygons, each polygon defined by shape, location coordinates and a direction vector that is perpendicular to the respective polygon, said direction vector pointing outwardly of said object and thereby distinguishing an inward face of said polygon from an outward face of said polygon;

defining a slicing plane characterized by a Z0 coordinate along the Z axis; and dividing said slicing plane into regions that are within the object, regions that belong to a support structure and regions that are outside the object and not to be printed.

In an embodiment, said identifying regions within said slice comprises:

finding a closest polygon of said envelope that is positioned above a respective region to be identified;

where no polygon is identified, then marking a corresponding region as a no-print region;

if a direction vector of a closest above polygon has a positive component in the Z direction, then marking said corresponding region as a model region;

if a direction vector of said closest above polygon has a negative component in the Z direction, then marking the region as a support region.

In an embodiment, said obtaining a representation further comprises orientating. An embodiment further comprises obtaining texture maps and mapping regions of texture onto said slices.

In an embodiment, said texture maps comprise maps defining color distribution, maps defining distribution of different materials and maps defining 3 dimensional surface texture.

In an embodiment, each region is a multi-voxel region, the method further comprising defining voxels in each region of said defined slice regions prior to printing.

An embodiment may comprise printing the object in layers, each layer corresponding to a respective slice of said plurality of planar slices, said each layer printed by: depositing support material in voxels of each region marked as a support region within said respective slice, depositing model material in voxels of each region marked as a model pixel within said respective slice.

In an embodiment, printing a layer immediately follows the corresponding virtual slicing, so that a layer is sliced and then immediately printed.

The method may be carried out on a graphics card or a graphical processing unit.

In a further aspect, the invention may extend to a sliced 3 dimensional model of an object to be printed, which is sliced as explained herein.

According to a yet further aspect of the present invention, there is provided a method for adding texture to a sliced three-dimensional model for printing of a corresponding object by a 3D printer, the method comprising:
obtaining a representation of an envelope of an object as a collection of planar polygons;
slicing the model across the envelope;
obtaining a texture map of said model; and
mapping said texture map onto said slices to generate regions of defined texture.

A further aspect of the invention relates to a sliced and texture-mapped 3 dimensional model of an object to be printed, sliced and texture mapped using a method as described herein.

A yet further aspect of the invention relates to a printed 3-dimensional object, printed from a sliced three-dimensional model generated as described herein.

A yet further aspect of the present embodiments relates to the use of a graphical printing unit (GPU) to slice a three-dimensional model of an object to be printed using any of the methods described herein.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

Figure 1:
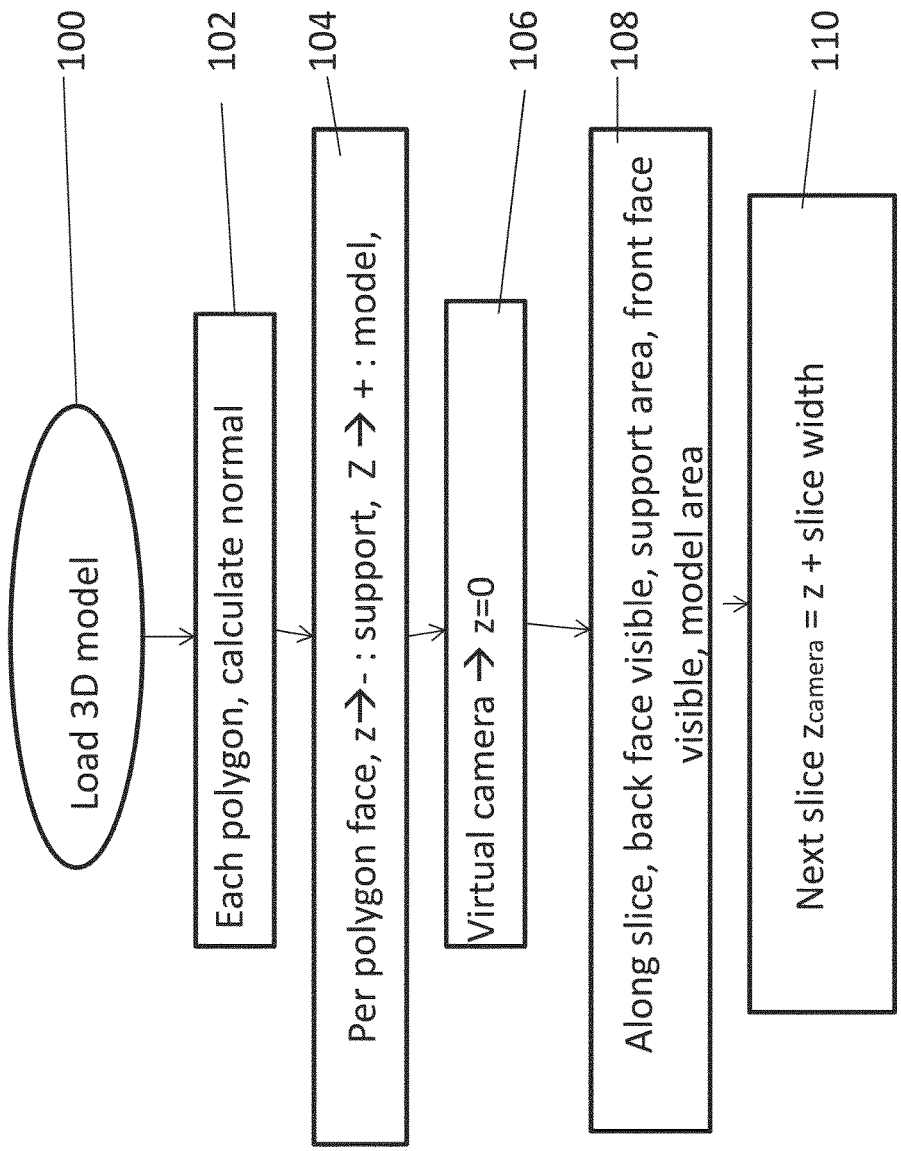
FIG. 1 is a simplified flow diagram illustrating a procedure for slicing a 3D model of an object to be printed, according to a first embodiment of the present invention.

DESCRIPTION OF SPECIFIC EMBODIMENTS
OF THE INVENTION

The present invention, in some embodiments thereof, relates to a way of carrying out slicing for three dimensional printing and, more particularly, but not exclusively, to a way that is particularly suitable for carrying out on a graphics card.

As will be explained in greater detail below, a method for slicing a three-dimensional model for printing of a corresponding object by a 3D printer, comprises: obtaining the envelope of the object as polygons, then for each region of a predefined work area within the slicing plane: identifying the closest polygon of the envelope that is positioned above the respective region; where no polygon is identified, then marking a corresponding region as a no-print region; if the direction vector of said closest above polygon has a positive component in the Z direction, then marking said corresponding region as a model region; and if the direction vector of said polygon has a negative component in the Z direction, then marking the region as a support region, and printing accordingly. An advantage of the above procedure is that the slicing can be efficiently carried out on a graphics card or GPU.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1 is a simplified flow diagram illustrating a procedure for implementing model slicing prior to object printing according to an embodiment of the present invention.

An embodiment of the invention may use the Graphics card viewing frustum, that is a virtual field of view function, to produce the 3D body that is the object to be printed and to divide the object into orthogonal sections (slices). The body is described by a set of polygons in 3D space which define the body surface.

The present embodiments may utilize the fact that surfaces with positive normal z-components—that is upwardly facing bodies—are not seen in orthogonal projections from the bottom, and can only be viewed from the inside of the body. Likewise downwardly facing surfaces are seen from the bottom and have negative normal z-components. These faces can be identified by initially supplying the surface with an orientation vector pointing to the inner body of the model. The orientation vector may be a normal to the polygon, and may have a component in the z direction.

In order to identify such surfaces, all polygon faces with positive z component of the normal are marked by a color indicating the model material, and all polygon faces with negative z component to the normal are marked with a color indicating a support region.

A slice may then be the result of orthogonal projection viewed from the bottom and may now contain the model and support areas marked by the respectively assigned colors.

As will be explained in greater detail below, 3D textures may now be assigned to or around the surfaces in the slices in the model, and the textures provide the desired surface 3D textures, the object surface colors, the different object materials if any, and structures for the support areas.

The features are assigned to regions of the slice and individual pixels are not calculated at this point.

As a result, a typical slicing process which needs to calculate several thousand slices and may conventionally take several hours, can be run much faster using the graphics accelerator HW to calculate slices uses orthogonal projection and clipping.

In greater detail, the slicing method involves using the graphics card viewing frustum to produce orthogonal sections, slices, of the 3D body. As successive slices are generated, the slicer eye point is gradually moved in the positive z direction according to the required slice resolution. The viewing frustum is modified accordingly.

Every slice may thus contain one or both of model and support areas, the areas being marked by the different color or pattern assigned to the model surface or near surface. The colors or patterns comprise the textures for the materials, heterogeneous combinations of materials, i.e., digital materials (DM) or support structures.

Referring again to FIG. 1, the first stage—as shown in box 100—is to load, or more precisely, MLoad, the 3D model or models to the graphics card for off-screen drawing. The model describes the object using a set of polygons that describe the surfaces of the object to be printed. The model is positioned according to desired positions and orientations.

All polygons are part of a 3D surface, and a 3D surface has an inside and an outside. In box 102, the normal of every polygon is calculated. In box 104 the z-components of the normals are found in order to mark the insides and outsides of the object. Starting at the bottom, all polygon faces with negatively signed z-components of the normal are marked by a particular color indicating support regions, and the positively oriented polygon faces are marked by the model color.

Subsequently, as shown in box 106, the position of the virtual camera (eye point) is set to z=0 to begin defining the first slice. The camera position then increments for each subsequent slice until the maximum height of the model is reached.

Then, as in box 108, for each one of the slices, each part of the slice is projected upwards to the next polygon surface as a virtual camera looking upwards is slid along the length of the slice. If the first polygon surface in view is a downward facing outer surface then that region of the slice is marked as a support region. If the surface is a downward facing inner surface then the region is marked as a part of the object itself. It will be appreciated that the slice is in fact a two-dimensional area so that the process has be carried out over the entire area.

As each slice is completed the camera or eye point is moved up the slice width in the z direction—box 110.

The graphics card's fast and parallel calculation possibilities may allow the slices as above to be calculated quickly, and as stated, the calculations relate to regions of the slice and not to individual pixels. Individual 3D pixels, or voxels, are calculated subsequently prior to printing, simply from the properties of the region to which they belong.

Figure 2:
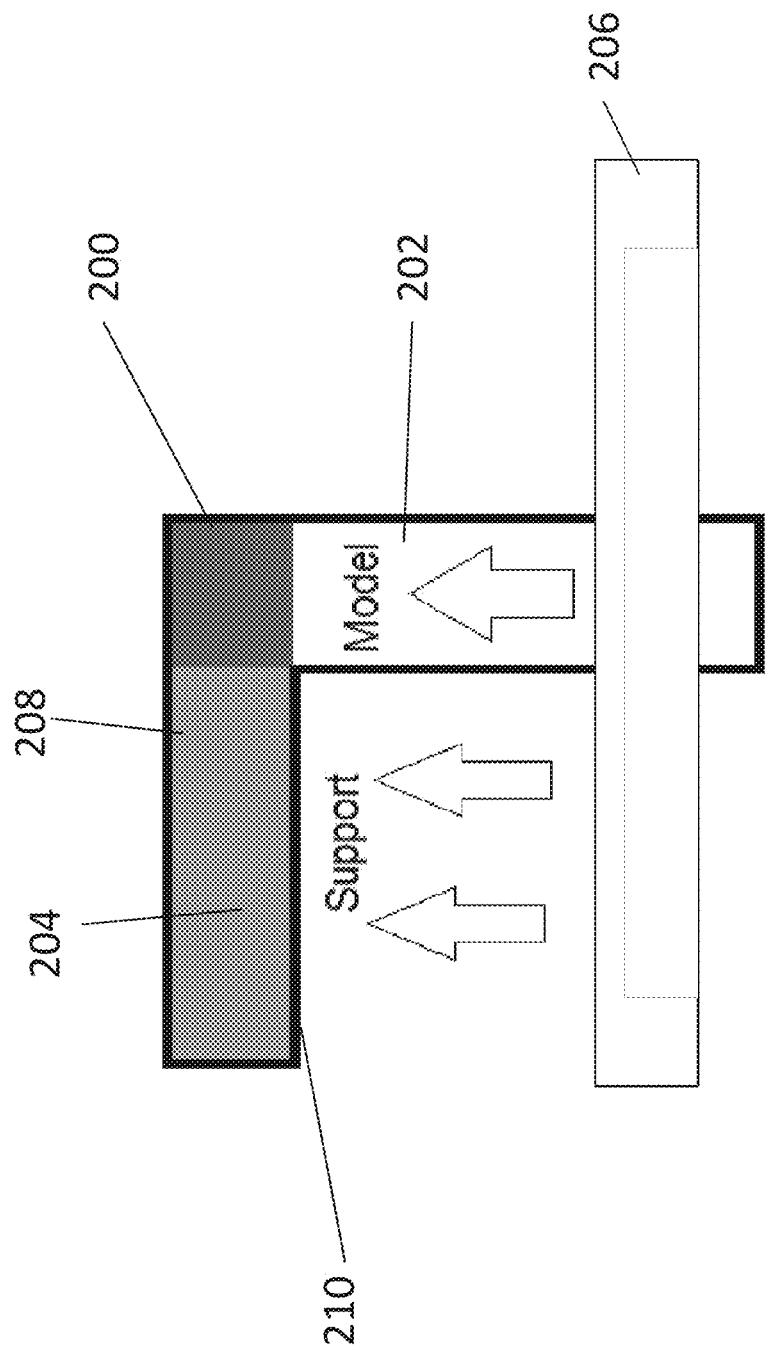
FIG. 2 is a schematic illustration of a 3D model to which the procedure of FIG. 1 is applied.

Reference is now made to FIG. 2, which is a simplified diagram illustrating how the above procedure may work on an L-shaped model piece 200. It will be appreciated that the model piece is a three-dimensional model piece, but is shown as 2D for simplicity. The piece has a vertical section 202 and a horizontal section 204, and the surfaces are defined by polygons and have an inner and an outer face to each surface.

Now we consider the calculation of slice 206. A virtual camera looking upwards is slid along the length of the slice. As long as the virtual camera is within the upright model part 202 then the first face that the virtual camera sees is the inward facing side of the upper wall 208. Hence the region of the slice within the vertical 202 is marked as being within the model.

As the virtual camera exits the upright and moves under the extension of the L shape, the first surface that the virtual camera meets is the downward facing external surface of lower wall 210. Hence the region outside the upright and under the extension of the L is marked as a support region.

In those parts of the slice that are neither within the model or under the extension of 204, but are outside the L shape altogether, the upward looking camera meets no polygon surface and thus the regions are marked as no print regions.

According to an embodiment of the invention, the graphics card may thus render the 3D scene by looking in the Z-direction, that is from the slice upwards, to form a parallel projection view. For each slice the camera is set on the z-plane of the slice (z-position of camera) and slides along a vector in the slice which is perpendicular to the z-plane (view direction) from bottom upwards.

The graphics card may thus automatically calculate the model and support regions using polygons, projections and polygon culling, ready for the later defining of the individual pixels within the region. All visible polygon faces with the normal vector pointed inside may be rendered and marked as belonging to the model and all visible polygons with the normal vector pointing outside may be rendered and marked as belonging to the support structure.

Now in general, simply mapping regions as model or support or non-print is not sufficient. Real world objects that users require to print need colors, different materials at different locations, surface patterns, 3D textures and the like. Again, the graphics processor can provide an answer. A texture mapping unit (TMU) is a component in modern graphics processing units (GPUs). A TMU is able to rotate and resize a bitmap to be placed onto an arbitrary plane of a given 3D object as a texture. In modern graphics cards a TMU is typically implemented as a discrete stage in a graphics pipeline.

To render a 3D scene, textures are mapped over the top of polygon meshes. This is called texture mapping and is accomplished by the TMUs on the graphic card.

A texture map may be applied, or mapped, to the surface of a shape or polygon. The application process is akin to applying patterned paper to a plain white box. For example, every vertex in a polygon may be assigned a texture coordinate either via explicit assignment or by procedural definition. Multitexturing is the use of more than one texture at a time on a polygon.

In an embodiment of the invention, texture mapping, as described above, can be used to generate the interesting or complex and multi-material structures of the model (e.g., DM) and of the support, for example to define the support as a grid.

Figure 3:
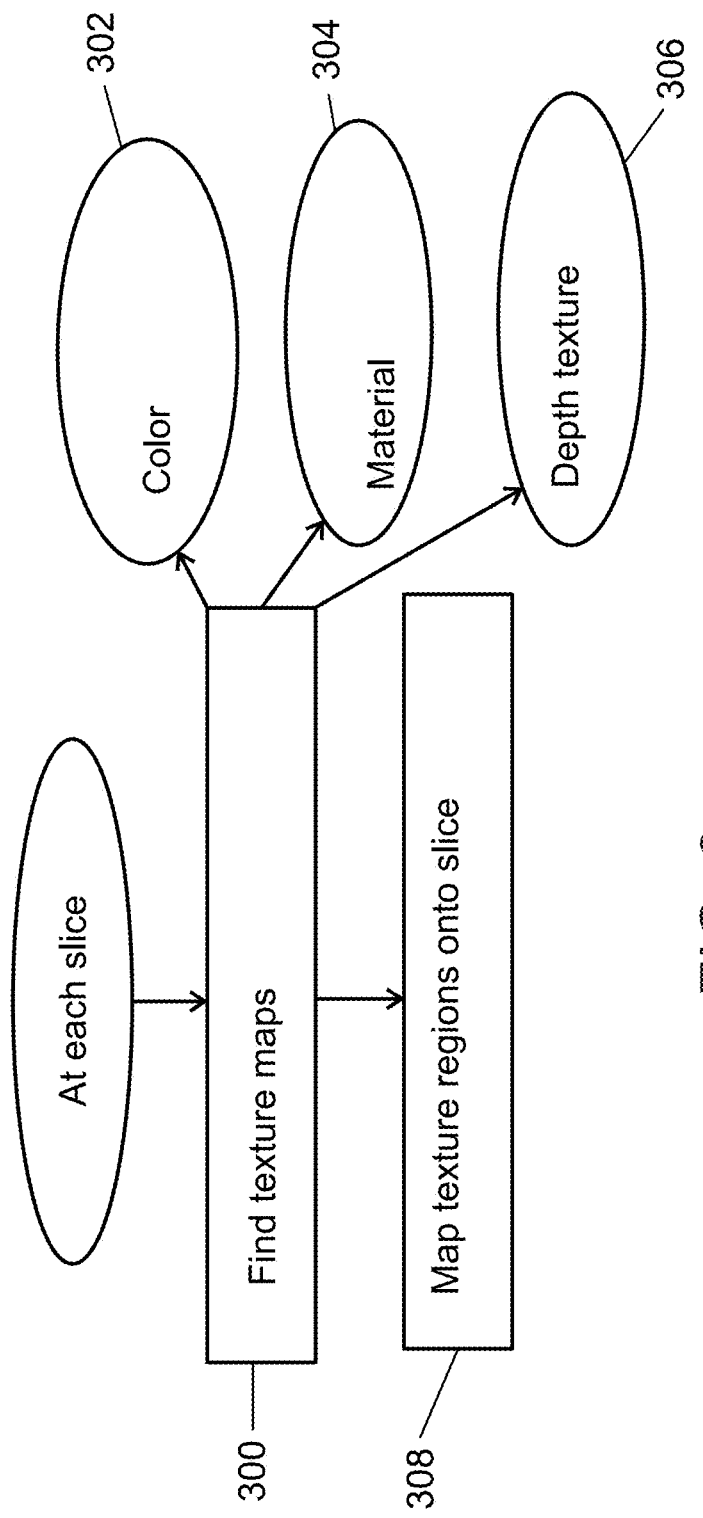
FIG. 3 is a simplified flow chart showing a modification of the procedure of FIG. 1 in order to map texture onto the 3D model.

The method is illustrated in the simplified flow chart FIG. 3. The method comprises using a predefined 2D or 3D texture or color map, and defining its mapping on the same polygons that define model shape. For the slices the texture map or maps are obtained, box 300. There may be separate texture maps for color and surface pattern 302, for different materials 304 and for different 3D depth texture 306. Further texture maps may be designed as needed, and different texture maps may be combined in one or more files for convenience. The texture map regions are mapped onto the slice regions in box 308. Different textures can be applied separately for the two different polygon sides, the outside and the inside, and after rendering, which is carried out as above, the output may include color and texture representation of the model or support structures.

The graphics processor does not have a direct way of representing different materials. However it is very good at representing color, and thus color can represent the different materials of the different voxels to be printed in the generated slice. Multitexturing can then be used to combine the colors that mean material type with the colors that are intended to appear on the object.

3D texture can further be used to generate structures with the depth. Because the depth is calculated from the surface the graphics processor may simply generate coated or multi-coated layer structures and gradient structures in the direction that is perpendicular to the surface plane as part of a projection process into the depth of the model. For example, a particular object may require a hard shell at the surface and soft filler material, or may require waterproofing at the surface. The texture maps are a way to allow the graphics processor to apply the relevant information to the regions in the slice.

It is expected that during the life of a patent maturing from this application many relevant ink jet and other printing technologies will be developed and the scope of the term 'printing" is intended to include all such new technologies a priori.

The terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment, and the above description is to be construed as if this combination were explicitly written. Conversely, various features of the invention, which are, for brevity, described in the context of a single embodiment, may also be provided separately or in any suitable subcombination or as suitable in any other described embodiment of the invention, and the above description is to be construed as if these separate embodiments were explicitly written. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method for slicing a three-dimensional model for printing of a corresponding object by a 3D printer, the slicing made within a space having a Z axis, the Z axis being perpendicular to a printing plane, the method comprising:
   obtaining a representation of an envelope of an object as a collection of planar polygons, each polygon defined by shape, location coordinates and a direction vector that is perpendicular to the respective polygon, said direction vector pointing outwardly of said object and thereby distinguishing an inward face of said polygon from an outward face of said polygon;
   defining a slicing plane characterized by a Z0 coordinate along the Z axis; and
   dividing said slicing plane into regions that are within the object, regions that belong to a support structure and regions that are outside the object and not to be printed.

2. The method of claim 1, wherein said dividing said slicing plane into regions that are within the object comprises:
   finding a closest polygon of said envelope that is positioned above a respective region to be identified;
   where no polygon is identified, then marking a corresponding region as a no-print region;
   if a direction vector of a closest above polygon has a positive component in the Z direction, then marking said corresponding region as a model region;
   if a direction vector of said closest above polygon has a negative component in the Z direction, then marking the region as a support region.

3. The method according to claim 1 wherein said obtaining a representation further comprises orientating.

4. The method according to claim 1, further comprising obtaining texture maps and mapping regions of texture onto said slices.

5. The method according to claim 4, wherein said texture maps comprise maps defining color distribution, maps defining distribution of different materials and maps defining 3 dimensional surface texture.

6. The method of claim 1, wherein each region is a multi-voxel region, the method further comprising defining voxels in each region of said defined slice regions prior to printing.

7. The method of claim 1, further comprising:
   printing the object in layers, each layer corresponding to a respective slice of said plurality of planar slices, said each layer printed by:
      depositing support material in voxels of each region marked as a support region within said respective slice,
      depositing model material in voxels of each region marked as a model pixel within said respective slice.

8. The method according to claim 1, wherein printing a layer immediately follows the corresponding virtual slicing.

9. The method according to claim 1 carried out on a graphics card or a graphical processing unit.

* * * * *